United States Patent
Hofmann et al.

[11] Patent Number: 5,998,261
[45] Date of Patent: Dec. 7, 1999

[54] METHOD OF PRODUCING A READ-ONLY STORAGE CELL ARRANGEMENT

[75] Inventors: Franz Hofmann; Wolfgang Rösner, both of München; Wolfgang Krautschneider, Hohenthann; Lothar Risch, Neubiberg, all of Germany

[73] Assignee: Siemens Aktiengesellschaft, Munich, Germany

[21] Appl. No.: 08/973,701

[22] PCT Filed: Jun. 25, 1996

[86] PCT No.: PCT/DE96/01117

§ 371 Date: Dec. 8, 1997

§ 102(e) Date: Dec. 8, 1997

[87] PCT Pub. No.: WO97/02599

PCT Pub. Date: Jan. 23, 1997

[30] Foreign Application Priority Data

Jul. 5, 1995 [DE] Germany .................. 195 24 478

[51] Int. Cl.⁶ .................................................. H01L 21/336
[52] U.S. Cl. ........................... 438/257; 438/259; 438/275
[58] Field of Search .................................... 438/257, 259, 438/268, 267, 270, 275, 276

[56] References Cited

U.S. PATENT DOCUMENTS

| | | | |
|---|---|---|---|
| 5,049,956 | 9/1991 | Yoshida | 357/23.5 |
| 5,180,680 | 1/1993 | Yang | 437/38 |
| 5,414,287 | 5/1995 | Hong | 257/316 |
| 5,460,989 | 10/1995 | Wake | 437/43 |
| 5,554,550 | 9/1996 | Yang | 437/43 |

FOREIGN PATENT DOCUMENTS

| | | |
|---|---|---|
| 32 19 854 C2 | 6/1992 | Germany . |
| 62-40 774 | 2/1987 | Japan . |
| 62-72 170 | 4/1987 | Japan . |
| 62-86 866 | 4/1987 | Japan . |
| 62-269 363 | 11/1987 | Japan . |
| 63-78 573 | 4/1988 | Japan . |
| 63-102 372 | 5/1988 | Japan . |
| 1-150 364 | 6/1989 | Japan . |
| 3-1 574 | 1/1991 | Japan . |

OTHER PUBLICATIONS

IBM Technical Disclosure Bulletin, vol. 35, No. 4B, Sep. 1992, "Vertical Eeprom Cell", pp. 130–131.

*Primary Examiner*—Joni Chang
*Attorney, Agent, or Firm*—Hill & Simpson

[57] ABSTRACT

An electrically writable and erasable read-only memory cell arrangement fabricated in a semiconductor substrate, preferably of monocrystalline silicon, or in a silicon layer of an SOI substrate. A cell array with memory cells is provided on a main surface of the semiconductor substrate. Each memory cell comprises an MOS transistor, vertical to the main surface and comprising, in addition to the source/drain region and a channel region arranged in-between, a first dielectric, a floating gate, a second dielectric and a control gate. A plurality of essentially parallel strip-shaped trenches are provided in the cell array. The vertical MOS transistors are arranged on the flanks of the trenches. The memory cells are in each case arranged on opposite flanks of the trenches.

4 Claims, 3 Drawing Sheets

METHOD OF PRODUCING A READ-ONLY STORAGE CELL ARRANGEMENT

BACKGROUND OF THE INVENTION

DESCRIPTION OF THE RELATED ART

Many applications require read-only memory cell arrangements with electrically writable and electrically erasable silicon-technology read-only memory cells, so-called EEPROMs. The stored data remain in these EEPROM arrangements even in the absence of a supply voltage.

From the technical point of view, these memory cells are usually produced by an MOS transistor which has, on the channel region, a first dielectric, a floating gate, a second dielectric and a control gate. If a charge is stored on the floating gate, then this charge affects the threshold voltage of the MOS transistor. In such a memory cell arrangement, the state "charge on the floating gate" is assigned to a first logic value, and the state "no charge on the floating gate" is assigned to a second logic value. The information is written into the memory cells by using a Fowler-Nordheim tunnelling current or by a "hot electron" current, by which electrons are injected onto the floating gate. The information is erased by a tunnelling current through the first dielectric. At least eight EEPROM transistors are connected to one another the other in series in a NAND arrangement.

The MOS transistors are designed as planar MOS transistors and are arranged in a planar cell architecture. The minimum area required for a memory cell is therefore equal to $4F^2$, F being the smallest producible structure size in the respective technology. EEPROM arrangements of this type are currently offered for maximum data volumes of 32 Mbit.

JP-A 3-1574 proposes an electrically writable and erasable read-only memory cell arrangement which comprises, as memory cells, MOS transistors which are vertical to a main surface of a semiconductor substrate and have a floating gate and a control gate. Essentially parallel strip-shaped trenches are provided in the substrate. The vertical MOS transistors are arranged on the flanks of the trenches. In this case, the memory cells are in each case arranged on opposite flanks of the trenches. Strip-shaped doped regions, which comprise the source and drain regions of the MOS transistors, extend in each case at the trench bottom and on the main surface between neighboring trenches. These strip-shaped doped regions are produced by masked implantation after the trenches have been formed. Because of the unavoidable alignment inaccuracy when masking steps are used, the packing density which can be achieved in this memory cell arrangement is limited.

US-A 5 049 956 discloses an electrically writable and erasable memory cell arrangement which comprises vertical MOS transistors, with floating gate and control gate, arranged in point-like trenches. A continuous doped layer, which acts as a common source region for all the MOS transistors, is provided at the bottom of the trenches. In order to increase the coupling capacitance, the floating gates protrude above the surface of the substrate.

Larger volumes of data can currently be stored in readable and erasable form only in dynamic memory cell arrangements (DRAM) or on magnetic data carriers. A DRAM continuously requires a supply voltage in order to retain the stored data. In contrast, magnetic data carriers are based on mechanical systems with rotating storage media.

The object of the invention is to provide a method for the production of a read-only memory cell arrangement which can be produced with a low area requirement per memory cell.

SUMMARY OF THE INVENTION

The electrically writable and erasable read-only memory cell arrangement produced by the method according to the invention is fabricated in a semiconductor substrate, preferably of monocrystalline silicon, or in a silicon layer of an SOI substrate. A cell array with memory cells is provided on a main surface of the semi-conductor substrate. Each memory cell comprises an MOS transistor, vertical to the main surface and comprising, in addition to the source/drain region and a channel region arranged in between, a first dielectric, a floating gate, a second dielectric and a control gate.

A plurality of essentially parallel strip-shaped trenches are provided in the cell array. The vertical MOS transistors are arranged on the flanks of the trenches. In this case, the memory cells are in each case arranged on opposite flanks of the trenches.

Strip-shaped doped regions extend in each case at the trench bottom and on the main surface between neighboring trenches. The strip-shaped doped regions adjoining the respective flank form the source/drain regions of the MOS transistors arranged on the flank. The first dielectric, the floating gate, the second dielectric and the control gate are in each case arranged along the flank between the corresponding source/drain regions. A multiplicity of memory cells are in each case arranged along a flank. The floating gate and the control gate are mutually insulated neighboring memory cells along a flank.

Word lines, extending transversely to the trenches, are in each case connected to the control gates of vertical MOS transistors which are arranged under the respective word line.

The floating gates preferably have a larger extent in the direction perpendicular to the surface than corresponds to the depth of the trenches. The floating gates thereby protrude above the main surface. The coupling capacitance between the floating gate and the control gate can in this way be increased.

If the separation between the neighboring trenches is chosen to be essentially equal to the width of the trenches, then the read-only memory cell arrangement according to the invention can be produced with the self-aligning production method with a space requirement per memory cell of $2F^2$, F being the minimum structure size in the respective technology. Only two photolithographically produced masks are required for self-aligning production of the read-only memory cell arrangement: one mask for etching the trenches and an additional mask for structuring the word lines which extend transversely to the trenches. The floating gates are formed by spacer etching, self-aligned with the flanks of the trenches. The floating gates and the second dielectric are structured, parallel to the extent of the trenches, by using the word-line mask.

The spacer etching for forming the floating gates is preferably carried out before the trench mask is removed. The extent of the floating gates, perpendicularly to the main surface, can then be adjusted by means of the thickness of the trench mask. The trench mask is removed before the deposition of a second dielectric layer for forming the second dielectric.

In cases where it is not necessary to increase the coupling capacitance between the floating gate and the control gate by increasing the extent of the floating gate, the trench mask is removed before the deposition of the first doped polysilicon layer for forming the floating gate.

BRIEF DESCRIPTION OF THE DRAWINGS

The invention is explained in more detail below with the aid of an illustrative embodiment and the figures.

DETAILED DESCRIPTION OF THE PREFERRED EMBODIMENTS

Figure 1:
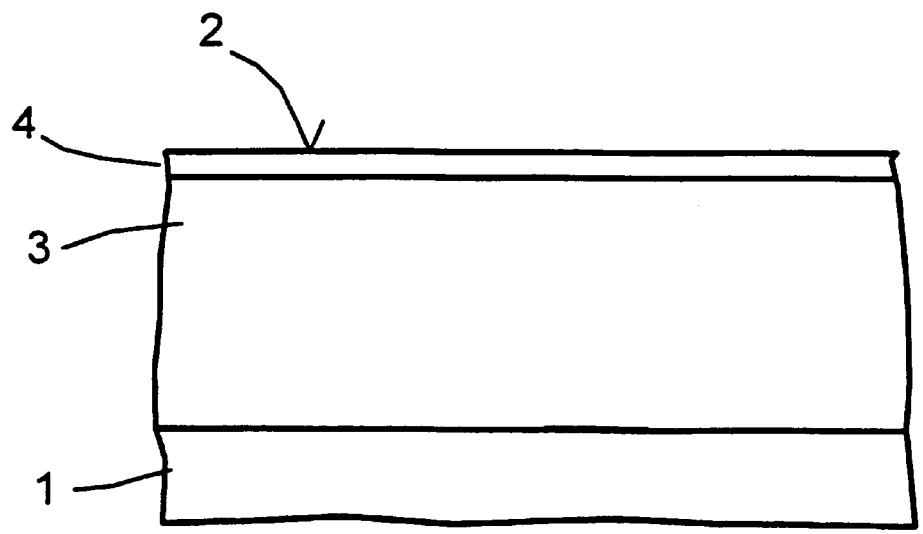
FIG. 1 shows a substrate with a doped region in the cell array.

A substrate 1 consisting of, for example, p-doped monocrystalline silicon with a dopant concentration of $5 \times 10^{15}$ $cm^{-3}$ is provided, on a main surface 2, with a screen oxide to a thickness of, for example, 50 nm (not represented). A p-doped well 3 with a dopant concentration of $3 \times 10^{17}$ $cm^{-3}$ is produced by boron implantation (160 kev, $6 \times 10^{13}$ $cm^{-2}$) and subsequent heat treatment (see FIG. 1). The screen oxide is then removed by etching.

An insulation structure (not represented) is subsequently formed at the edge of the p-doped well 3, for example in an LOCOS process. The insulation structure defines the region for the cell array.

After a further 20 nm screen oxide (not represented) has been formed, an $n^+$-doped region 4 is produced by arsenic implantation, 50 keV, $5 \times 10^{15}$ $cm^{-2}$. The $n^+$-doped region 4 has a dopant concentration of $1 \times 10^{21}$ $cm^{-3}$. It extends on the main surface 2 over the region for the cell array. The depth of the $n^+$-doped region 4 is, for example, equal to 200 nm.

Figure 2:
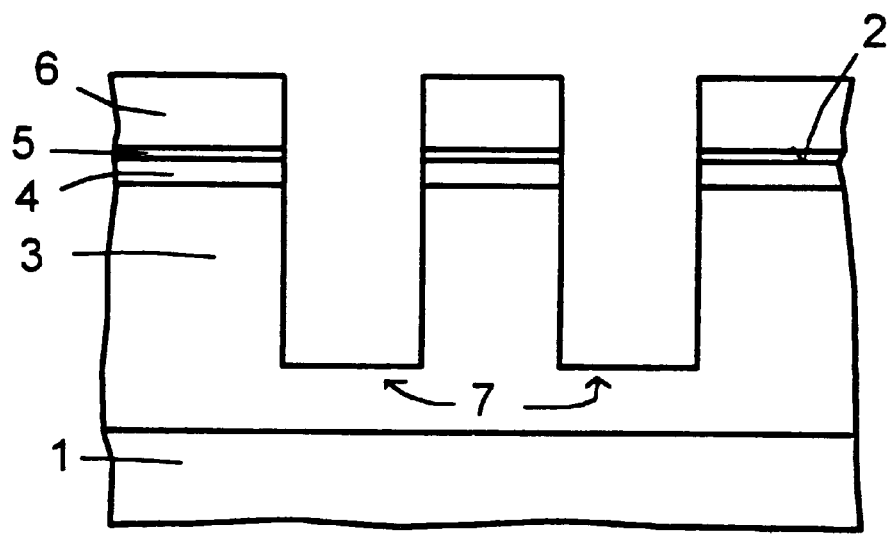
FIG. 2 shows the substrate with a trench mask after the trenches have been etched.

After the screen oxide has been removed, a layer of $SiO_2$ is produced on the main surface 2 to a thickness of, for example, 50 nm by thermal oxidation at, for example, 800° C., and a nitride layer is formed to a thickness of 50 nm by CVD. The $SiO_2$ layer and the nitride layer form an auxiliary layer 5 (see FIG. 2).

Subsequently, in order to form a trench mask 6, a 300 nm thick $SiO_2$ layer is deposited in a TEOS process and is structured with the aid of photolithographic methods by anisotropic dry etching, for example with $CHF_3$, $O_2$.

The auxiliary layer 5 is then structured in accordance with the trench mask 6 by anisotropic dry etching. The auxiliary layer 5 is etched, for example, with $CHF_3$, $O_2$. After removal of a photoresist mask which was applied for structuring the trench mask 6, trench etching is carried out. The trench etching takes place in an anisotropic dry etching process with, for example, HBr, He, $O_2$, $NF_3$. Trenches 7 having a depth of, for example, 0.6 µm, are thereby produced. The trenches 8 extend over a block of the NAND cell array. They have a length of, for example, 8 µm and a width of, for example, 0.4 µm. Neighboring trenches 7 are arranged at a separation of 0.4 µm in the cell array. The trenches 7 are essentially parallel.

Figure 3:
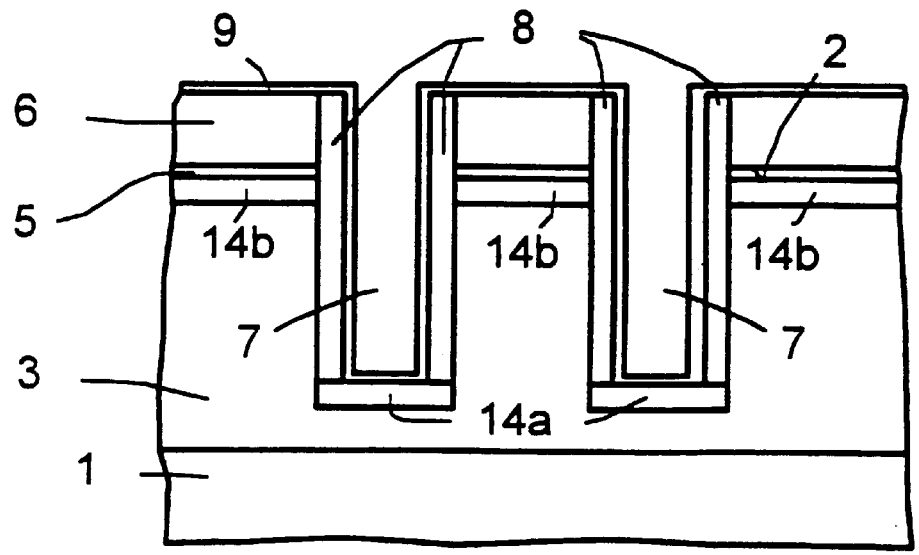
FIG. 3 shows the substrate after strip-shaped doped regions have been formed at the bottom of the trenches.
Figure 4:
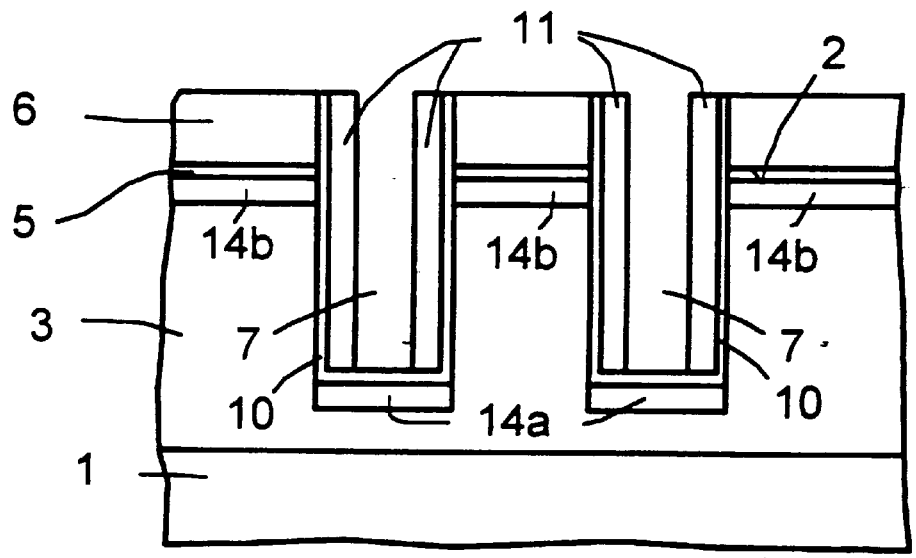
FIG. 4 shows the substrate after the formation of a first dielectric and doped polysilicon spacer on the flanks of the trenches.

By conformal deposition, a 20 nm thick TEOS layer (not represented) and then an $Si_3N_4$ layer to a thickness of, for example, 80 nm are produced. $Si_3N_4$ spacers 8 are formed by subsequent anisotropic dry etching with $CHF_3$, $O_2$ on vertical flanks of the trenches 7 and of the trench mask 6 (see FIG. 3).

A screen oxide layer 9 is then deposited to a thickness of 20 nm in a TEOS method over the entire surface. Ion implantation ($5 \times 10^{15}$ $cm^{-2}$, 50 keV) is carried out, with n+-doped strip-shaped regions 14a being formed at the bottom of the trenches 7. The doped regions 14a are activated by a heat treatment step. A dopant concentration of, for example, $1 \times 10^{21}$ $cm^{-3}$ is set in the strip-shaped doped regions 14a.

The $Si_3N_4$ spacers 8 mask the flank of the trenches 7 during the ion implantation. This avoids a shift in the threshold voltage of the vertical MOS transistors created on the flanks of the trenches 7.

Strip-shaped doped regions 14b are created on the main surface 2 of the semiconductor substrate 1 during the trench etching by structuring the $n^+$-doped region 4 between neighboring trenches 7.

The screen oxide 9 is then removed, for example in an HF dip. The $Si_3N_4$ spacers 8 are removed by wet chemical etching, for example with $H_3PO_4$. The thin oxide sublayer is then removed by wet chemical means using HF. Silicon surfaces are then left uncovered on the flanks and at the bottom in the trenches 7.

A first dielectric layer 10 consisting of $SiO_2$ is formed by thermal oxidation, for example at 800° C., at least on the exposed silicon surfaces. The first dielectric layer 10 is formed on the flanks with a thickness of, for example, 10 nm. Because of the increased doping of the strip-shaped doped regions 14a at the bottom of the trenches 7, the first dielectric layer is created there to a thickness of 50 nm.

Doped polysilicon spacers 11 are produced on the flanks of the trenches by deposition of an in-situ doped polysilicon layer to a thickness of, for example, 100 nm and subsequent anisotropic etching-back.

In order to form the doped polysilicon spacers 11, it is also possible to deposit an undoped polysilicon layer which is subsequently doped by extraneous means.

Figure 5:
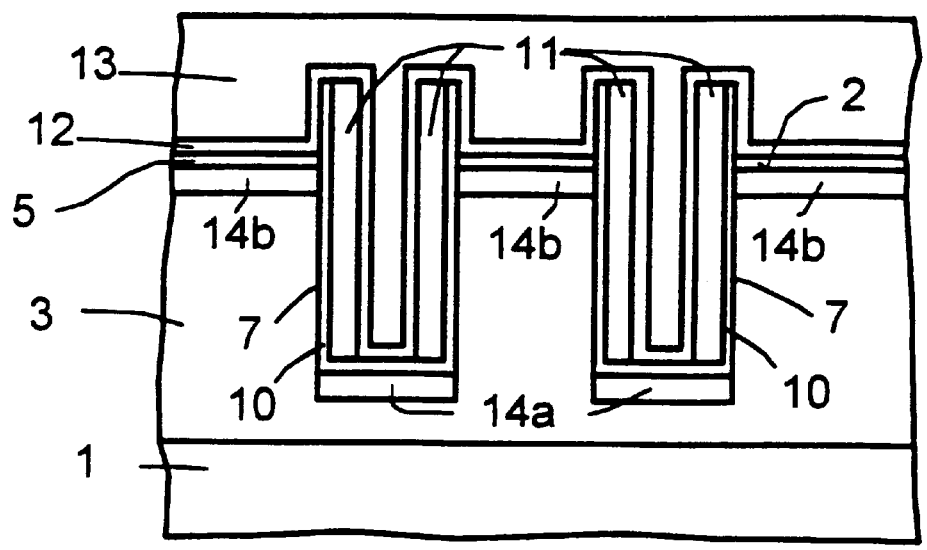
FIG. 5 shows the substrate after the deposition of a second dielectric layer and of a second doped polysilicon layer.

The trench mask 6 is then removed by wet etching, for example with HF vapour. In this etching, $SiO_2$ deposited in a TEOS method is removed selectively with respect to thermal $SiO_2$. The auxiliary layer 5 and the first dielectric layer 10 on the surface of the strip-shaped doped regions 14a, b are not attacked during this etching (see FIG. 5). This etching is furthermore selective with respect to polysilicon. After the trench mask 6 has been removed, the doped polysilicon spacers 11 protrude above the main surface 2. The extent of the polyilicon spacers 11 in the direction vertical to the main surface 2 is determined by the thickness of the trench mask 6.

A second dielectric layer 12 is then produced over the entire surface. The second dielectric layer 12 is formed as a multiple layer consisting of a first $SiO_2$ layer, an $Si_3N_4$ layer and a second $SiO_2$ layer. In this case, the $Si_3N_4$ layer is deposited in a CVD process, and the first and second $SiO_2$ layers are formed by thermal oxidation. The second dielectric layer 12 is formed to a thickness of 8 nm.

A second doped polysilicon layer 13 is then deposited. The second doped polysilicon layer 13 is deposited with in-situ doping. It is deposited to a thickness of, for example, 500 nm. The second doped polysilicon layer 13 completely fills the trenches 7. It likewise fills the intermediate space between neighboring polysilicon spacers 11 on the main surface 2.

A word-line mask is then formed by depositing a TEOS $SiO_2$ layer to a thickness of, for example, 100 nm and structuring the TEOS $SiO_2$ layer with the aid of photolithographic process steps (not represented). The word-line mask defines word lines extending transversely to the trenches 7. The second polysilicon layer 13 is structured in anisotropic dry etching process, for example with HBr, $Cl_2$, He, with the word-line mask being used as an etching mask. This creates word lines 13a extending transversely to the trenches (see the plan view in FIG. 6) and control gates in the region of the trenches 7. The etching is stopped as soon as the surface of the second dielectric layer 12 is exposed.

The second dielectric layer 12 is then etched in a further dry etching process, for example with $CHF_3$, $O_2$ in the case of ONO. The polysilicon is then again etched (HBr, $Cl_2$, He) with high selectivity with respect to (oxide/nitride). In this case the floating gate and the control gate are now also etched as far as the bottom of the trench. Floating gates are formed from the doped polysilicon spacer 11 during this etching.

The second dielectric layer 12 is then removed by wet etching, for example with HF, $H_3PO_4$.

During the structuring of the doped polysilicon spacers 11, of the second dielectric layer 12 and of the second doped polysilicon layer 13 in accordance with the extent of the word lines 13a, the first dielectric layer 10 is exposed between neighboring word lines 13a in the trenches 7. This means that the trenches 7 are open between neighboring word lines 13a as far as the first dielectric layer 10. This intermediate space is then filled by depositing a TEOS $SiO_2$ layer to a layer thickness of, for example, 800 nm and etching back the TEOS $SiO_2$ layer until the surface of the word lines 13a is exposed (not represented).

Finally, a planarizing intermediate oxide layer, for example of boron-phosphorus silicate glass, is deposited over the entire area, and contact holes are opened in this layer. Contact holes are, amongst other things, opened to the word lines 13a, to the strip-shaped doped regions 14a which are arranged at the bottom of the trenches 7, and to the strip-shaped doped regions 14b which are arranged on the main surface 2 between neighboring trenches 7. The contact holes are, for example, filled with aluminium. A metallization plane is now produced, for example by depositing and structuring an aluminium layer. A passivation layer is finally applied. These standard steps are not represented in detail.

In the read-only memory cell arrangement produced according to the invention, the individual memory cells are evaluated according to the "virtual ground" principle. Each of the strip-shaped doped regions 14a, 14b is assigned to two rows of the memory cells. One pair of the strip-shaped doped regions 14a, 14b, which is composed of adjacently arranged doped regions 14a on the main surface and 14b at the bottom, is in this case unambiguously assigned to one row of memory cells. Thus, when the read-only memory cell arrangement is read, after selection via the word line 13a, the flow of current between a strip-shaped doped region 14a at the bottom of an insulation trench and a neighboring strip-shaped doped region 14b on the main surface 2 is evaluated. The strip-shaped doped regions 14a, 14b at the bottom of the trenches 7 and on the main surface 2 act, depending on the wiring configuration, as a reference line or bit line.

The information is written to the memory cells, as is conventional in the case of EEPROM arrangements, by "hot electron" injection. The memory cells are erased in a Fowler-Nordheim process.

For the purpose of programming, a first supply voltage, for example $V_{dd}$, is applied to the doped strip-shaped regions 14a, 14b to the left of a selector transistor, and a second supply voltage, for example $V_{as}$, is applied to the doped strip-shaped regions 14a, 14b to the right of the selector transistor. A high gate voltage of, for example, 7 volts is applied to the part of the word line 13a which is arranged in the trench 7 and acts as a control gate. Electrons are thereby injected into the associated floating gate.

In order to erase the information, the floating gates are discharged to the substrate by a Fowler-Nordheim process.

Figure 6:
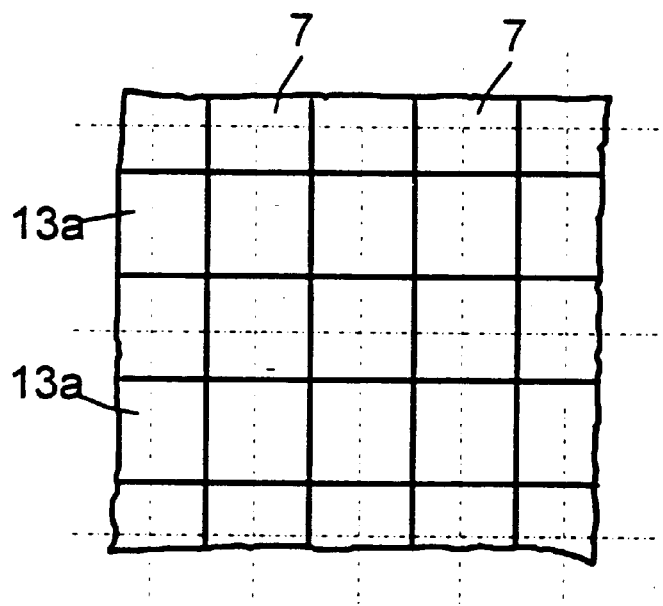
FIG. 6 shows a plan view of the finished electrically writable and erasable read-only memory cell arrangement.

FIG. 6 shows a plan view of the cell array of the read-only memory cell arrangement according to the invention. The cell size of the memory cells is indicated as a dot-dash line. The width of the memory cells is composed of half the width of the trench 7 plus half the separation between neighboring trenches. The length of a memory cell is composed of the width of the word line 13a plus twice the half-separation between neighboring word lines 13a. If the trenches 7 are formed with a width of F and at a separation of F, and if the word lines 13a are formed with a width of F and a separation of F, F being the minimum structure size in the respective technology, then a memory cell area of $2F^2$ is obtained.

We claim:

1. A method for producing a read-only memory cell array in which each memory cell thereof comprises a MOS transistor vertical to a main face with a first dielectric, a floating gate, a second dielectric and a control gate on a main surface of a semiconductor substrate, said method comprising the steps of:

doping the semiconductor substrate with a first conductivity type at least in a region of said cell array, doping a second region, which extends over an area of the entire cell array, with a second conductivity type on the main surface of the semiconductor substrate;

producing a trench mask;

etching a plurality of substantially parallel strip-shaped trenches in the main surface with an anisotropic dry etching process using the trench mask as an etching mask;

structuring the region doped with the second conductivity type during the etching of the trenches to produce stripe-shaped regions arranged on the main surface parallel to and between adjacent trenches;

forming stripe-shaped regions at the bottom of the trenches doped with thesecond conductivity type by ion implantation, wherein the trench mask acts as an implantation mask, said stripe-shaped regions serving as bit or reference lines for the memory cell array;

forming the first dielectric, the floating gate, the second dielectric and the control gate for each of the vertical MOS transistors on the opposite flanks of the trenches, after forming the stripe-shaped regions at the bottom of the trenches; and forming word lines which extend transversely to the trenches;

wherein, the floating gate and the control gate of adjacent MOS transistors along a flank are insulated from each other, the stripe-shaped regions on the bottom of the trenches and the stripe-shaped regions on the main surface between adjacent trenches have the same width so that they are characterized by the same resistance; and the word lines are connected to the control gates of the vertical MOS transistors positioned below the word lines.

2. A method according to claim 1, wherein, before the ion implantation for forming the stripe-shaped doped regions at the bottom of the trenches, the side walls of the trenches are covered with masking spacers which are removed after ion implantation.

3. A method according to claim 1, in which, after all of the strip-shaped doped regions have been formed, a first dielectric layer which covers at least the flanks of the trenches is produced, wherein a first doped polysilicon layer is produced on the first dielectric layer, and doped polysilicon spacers are formed by anisotropic etching from the first doped polysilicon layer, and further comprising:

forming a second dielectric layer;

forming a second doped polysilicon layer;

forming the word lines and control gates by structuring the second polysilicon layer with a word-line mask, and wherein the second dielectric and the floating gate for the MOS transistors are in each case formed by structuring the second dielectric layer and the doped polysilicon spacers.

4. A method according to claim 3, further comprising the step of removing the trench mask after the doped polysilicon spacers have been formed.

* * * * *